(12) United States Patent
Kuo et al.

(10) Patent No.: US 7,601,955 B2
(45) Date of Patent: Oct. 13, 2009

(54) SCANNING ELECTRON MICROSCOPE

(75) Inventors: Yang-Kuao Kuo, Hsinchu (TW);
Kuo-Hsing Teng, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 276 days.

(21) Appl. No.: 11/896,622

(22) Filed: Sep. 4, 2007

(65) Prior Publication Data
US 2009/0057555 A1    Mar. 5, 2009

(51) Int. Cl.
*G01N 7/00* (2006.01)
(52) U.S. Cl. .................. 250/310; 250/311; 250/306
(58) Field of Classification Search .......... 250/306, 250/307, 310, 311
See application file for complete search history.

(56) References Cited

U.S. PATENT DOCUMENTS 5,872,358 A    2/1999    Todokoro et al.

FOREIGN PATENT DOCUMENTS

CN    1643648    7/2005

*Primary Examiner*—Jack I Berman
*Assistant Examiner*—Hanway Chang
(74) *Attorney, Agent, or Firm*—Muncy, Geissler, Olds & Lowe, PLLC

(57) ABSTRACT

A scanning electron microscope is provided. The scanning electron microscope includes an electron beam source generating a primary electron beam, a condenser lens converging the primary electron beam, a base plate with a diamond film formed on the surface thereof having an aperture for passing of the primary electron beam, and a scanning unit two-dimensionally scanning a specimen with the primary electron beam.

14 Claims, 2 Drawing Sheets

SCANNING ELECTRON MICROSCOPE

BACKGROUND OF THE INVENTION

1. Field of the Invention

The invention relates to a scanning electron microscope, and in particular to a scanning electron microscope with a diamond film.

2. Description of the Related Art

Along with rapid integration of semiconductor devices, a scanning electron microscope (SEM) is used for observation and inspection of a refined circuit pattern. A scanning electron microscope scans a specimen with electron beams, detects secondary electrons emitted from the specimen following a bombardment by electron beams, and displays a secondary electron image representing the scanned objects on a display screen. This technology is suitable for observation of minute structures for the semiconductor manufacturing fields.

A conventional scanning electron microscope is disclosed in FIG. 1. The scanning electron microscope 1 comprises an electron beam source 2, a condenser lens 4, a base plate 5, an aperture 6, a scanning unit 7, an objective 8, a specimen 9, and a detector 11.

The electron beam source 2 generates a primary electron beam 3. The condenser lens 4 converges the primary electron beam 3. The aperture 6 is formed in the base plate 5 for passing of the primary electron beam 3. The scanning unit 7 two-dimensionally scans the specimen 9 with the primary electron beam 3. The objective 8 disposed between the scanning unit 7 and the specimen 9 focuses the primary electron beam 3. The detector 11 detects secondary electrons generated by the specimen 9 irradiated with the primary electron beam 3.

The conventional base plate having the aperture is formed of molybdenum (Mo). However, the edge of the aperture is easily transformed by continuous electron beam shooting due to insufficient hardness of the molybdenum (Mo) material, resulting in deterioration of image quality. Generally, the base plate should be replaced every month, thus resulting in additional costs.

BRIEF SUMMARY OF THE INVENTION

One embodiment of the invention provides a scanning electron microscope comprising an electron beam source generating a primary electron beam, a condenser lens converging the primary electron beam, a base plate with a diamond film formed on the surface thereof having an aperture for passing of the primary electron beam, and a scanning unit two-dimensionally scanning a specimen with the primary electron beam. The scanning electron microscope further comprises an objective focusing the primary electron beam disposed between the scanning unit and the specimen and a detector detecting secondary electrons generated by the specimen irradiated with the primary electron beam.

In an embodiment, an operational process of the scanning electron microscope (SEM) is disclosed. A primary electron beam is emitted and accelerated by the electron beam source. The primary electron beam is then converged by the condenser lens. The converged primary electron beam then passes through the aperture of the base plate coated with the diamond film. After passing through the scanning unit, the primary electron beam is focused again by the objective on the surface of the specimen. A two-dimensional scan with the primary electron beam is then performed. When the primary electron beam is irradiated on the specimen surface, secondary electrons or backscattered electrons are generated and detected by the detector. Finally, a two-dimensional electron image is formed.

During the operational process, the electron beam may continuously shoot at the edge of the aperture. Additionally, to avoid particle contamination, a heating process is required. Thus, the diamond material possessing sufficient hardness and high thermal conductivity is suitable for use in the invention to avoid aperture transformation caused by continuous electron beam shooting and high temperature. The hard diamond film can thus be chronically utilized without replacement, effectively reducing cost. The insulating diamond material also avoids electron delivery, increasing electron beam intensity.

Additionally, the diamond film is formed by conventional chemical vapor deposition (CVD), so that a thin diamond film, for example, with nano level, is easily acquired with low fabrication costs.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
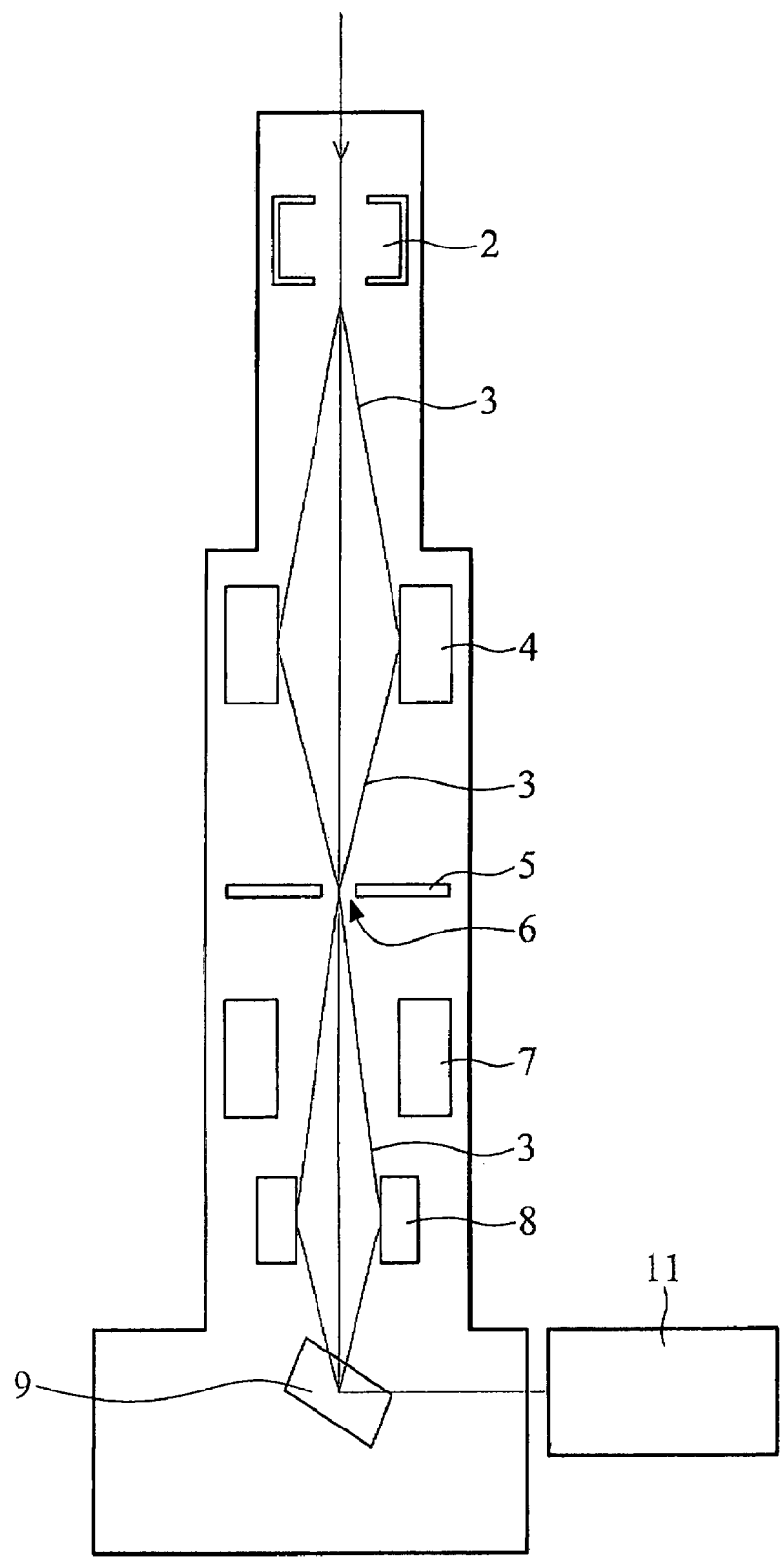
FIG. 1 shows a conventional scanning electron microscope.
Figure 2:
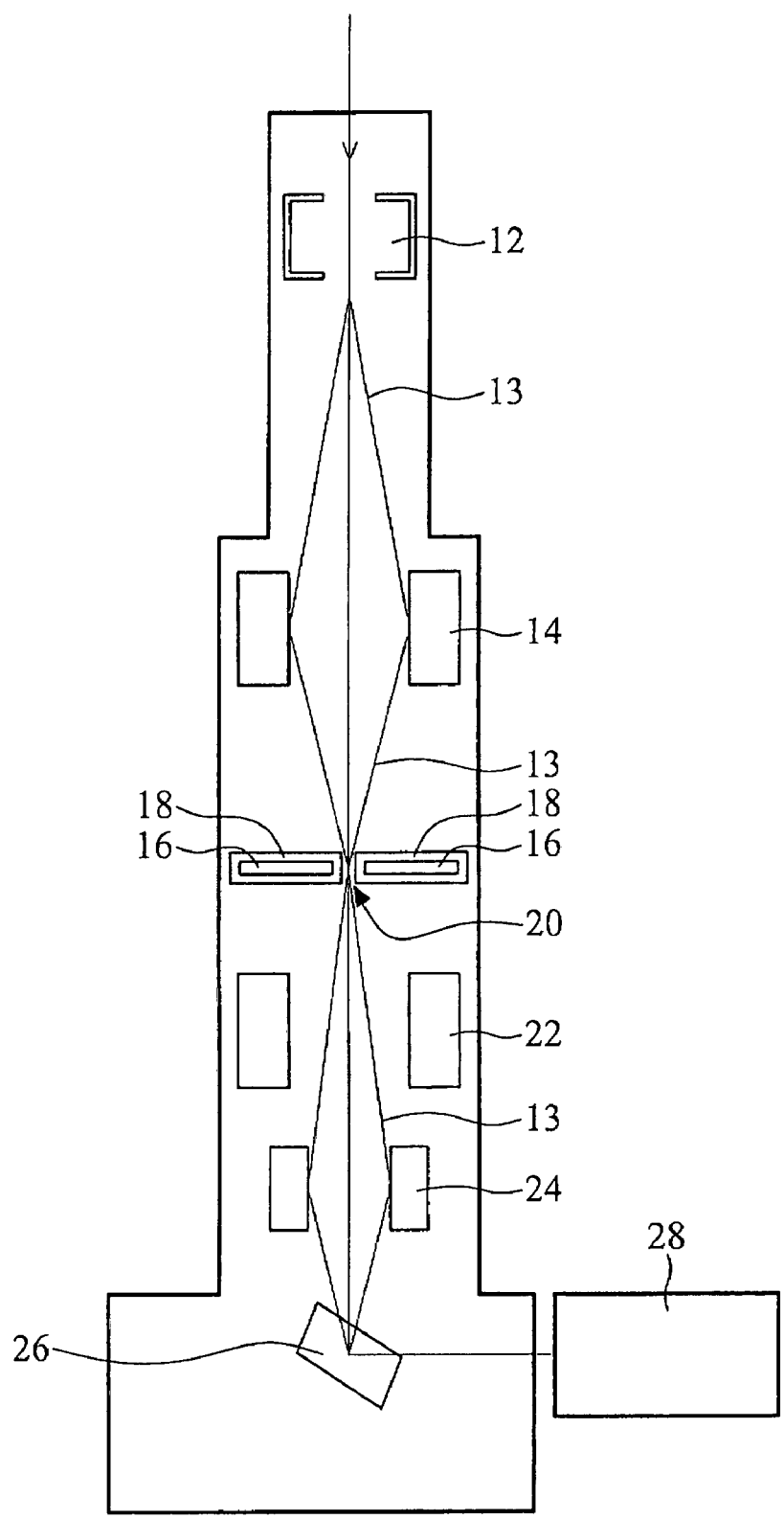
FIG. 2 shows a scanning electron microscope in an embodiment of the invention.

In an embodiment, a scanning electron microscope is disclosed, as shown in FIG. 2. The scanning electron microscope 10 comprises an electron beam source 12, a condenser lens 14, a base plate 16, a diamond film 18, an aperture 20, a scanning unit 22, an objective 24, a specimen 26, and a detector 28.

The electron beam source 12 generates a primary electron beam 13. The condenser lens 14 converges the primary electron beam 13. The diamond film 18 is formed on the surface of the base plate 16. The aperture 20 is formed in the base plate 16 for passing of the primary electron beam 13. The scanning unit 22 two-dimensionally scans the specimen 26 with the primary electron beam 13. The objective 24 disposed between the scanning unit 22 and the specimen 26 focuses the primary electron beam 13. The detector 28 detects secondary electrons generated by the specimen 26 irradiated with the primary electron beam 13.

The electron beam source 12 may comprise a heating electron emission type or field electron emission type, such as an electron gun. The condenser lens 14 may comprise an electrostatic lens or magnetic field lens. The base plate 16 has a thickness of about 0.05~0.15 mm or 0.1 mm and may comprise molybdenum (Mo). The diamond film 18 has a thickness of about 10~100 nm. During the operational process, the diamond film 18 is heated to a temperature of about 60~80° C. or 70° C. to avoid particle contamination. The diamond film 18 is a superior thermal conductor having a heat transfer rate of about 1200 W/mK and an insulator. The diamond film 18 is formed by chemical vapor deposition (CVD). The aperture 20 has a diameter of about 0.1 mm~0.35 mm.

In an embodiment, the operational process of the scanning electron microscope (SEM) is disclosed. Also referring to FIG. 2, a primary electron beam 13 is emitted and accelerated by the electron beam source 12. The primary electron beam 13 is then converged by the condenser lens 14. The converged primary electron beam 13 then passes through the aperture 20 of the base plate 16 coated with the diamond film 18. After passing through the scanning unit 22, the primary electron beam 13 is focused again by the objective 24 on the surface of the specimen 26, for example, a wafer surface. A two-dimensional scan with the primary electron beam 13 is then performed. When the primary electron beam 13 is irradiated on the specimen surface, secondary electrons or backscattered electrons are generated and detected by the detector 28. Finally, a two-dimensional electron image is formed.

During the operational process, the electron beam may continuously shoot at the edge of the aperture. Additionally, to avoid particle contamination, a heating process is required. Thus, the diamond material possessing sufficient hardness and high thermal conductivity is suitable for use in the invention to avoid aperture transformation caused by continuous electron beam shooting and high temperature. The hard diamond film can thus be chronically utilized without replacement, effectively reducing cost. The insulating diamond material also avoids electron delivery, increasing electron beam intensity.

Additionally, the diamond film is formed by conventional chemical vapor deposition (CVD), so that a thin diamond film, for example, with nano level, is easily acquired with low fabrication costs.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A scanning electron microscope, comprising:
    an electron beam source generating a primary electron beam;
    a condenser lens converging the primary electron beam;
    a base plate with a diamond film formed on the surface thereof having an aperture for passing of the primary electron beam; and
    a scanning unit two-dimensionally scanning a specimen with the primary electron beam.

2. The scanning electron microscope as claimed in claim 1, wherein the electron beam source comprises a heating electron emission type or field electron emission type.

3. The scanning electron microscope as claimed in claim 1, wherein the electron beam source is an electron gun.

4. The scanning electron microscope as claimed in claim 1, wherein the condenser lens comprises an electrostatic lens or magnetic field lens.

5. The scanning electron microscope as claimed in claim 1, wherein the base plate has a thickness of about 0.05~0.15 mm.

6. The scanning electron microscope as claimed in claim 1, wherein the base plate comprises molybdenum (Mo).

7. The scanning electron microscope as claimed in claim 1, wherein the diamond film has a thickness of about 10~100 nm.

8. The scanning electron microscope as claimed in claim 1, wherein the diamond film has a temperature of about 60~80° C.

9. The scanning electron microscope as claimed in claim 1, wherein the diamond film has a heat transfer rate of about 1200 W/mK.

10. The scanning electron microscope as claimed in claim 1, wherein the diamond film is an insulator.

11. The scanning electron microscope as claimed in claim 1, wherein the diamond film is formed by chemical vapor deposition (CVD).

12. The scanning electron microscope as claimed in claim 1, wherein the aperture has a diameter of about 0.1 nm~0.2 mm.

13. The scanning electron microscope as claimed in claim 1, further comprising an objective focusing the primary electron beam disposed between the scanning unit and the specimen.

14. The scanning electron microscope as claimed in claim 1, further comprising a detector detecting secondary electrons generated by the specimen irradiated with the primary electron beam.

* * * * *